United States Patent [19]

Cate et al.

[11] 4,247,789

[45] Jan. 27, 1981

[54] ELECTRONIC CIRCUITRY FOR MULTIPLYING/DIVIDING ANALOG INPUT SIGNALS

[75] Inventors: Thomas M. Cate, Cupertino; James C. Schmoock, San Jose, both of Calif.

[73] Assignee: Raytheon Company, Lexington, Mass.

[21] Appl. No.: 894,459

[22] Filed: Apr. 7, 1978

[51] Int. Cl.³ .......................... G06G 7/12; H03F 3/45

[52] U.S. Cl. .................................... 307/230; 307/254; 328/144; 328/160; 330/260

[58] Field of Search ....................... 307/229, 230, 254; 328/144, 145, 160; 330/260

[56] References Cited

U.S. PATENT DOCUMENTS

| | | | |
|---|---|---|---|
| 3,805,092 | 4/1974 | Henson | 328/160 |
| 4,004,141 | 1/1977 | Curtis | 328/145 |
| 4,100,433 | 7/1978 | Puffy et al. | 328/145 |
| 4,157,512 | 6/1979 | Schmoock | 328/160 |

*Primary Examiner*—Stanley D. Miller, Jr.
*Assistant Examiner*—B. P. Davis
*Attorney, Agent, or Firm*—Richard M. Sharkansky; Joseph D. Pannone

[57] ABSTRACT

An electronic circuit adapted to multiply/divide analog input signals, such circuit having a first set of four transistors with serially coupled base-emitter junctions arranged to produce an output current in the collector electrode of one of such transistors which is proportional to the product of currents fed into the collector electrodes of a second and third ones of the four transistors divided by current fed into the collector electrode of a fourth one of the transistors. The circuit includes a second set of four transistors, each one having a base electrode and an emitter electrode connected to the base electrode and emitter electrode, respectively, of a corresponding one of the first set of transistors to produce a current in the collector electrode thereof related to the current flow through the ohmic emitter resistance of the corresponding one of the transistors in the first set coupled thereto. Resistors, having resistances related to the ohmic emitter resistances of the first set of transistors, are coupled to the collector electrodes of the second set of transistors for producing a voltage in series with the serially coupled base-emitter junctions of the first set of transistors related to the voltages produced across the ohmic emitter resistances of the first set of transistors.

17 Claims, 5 Drawing Figures

FIG. 4
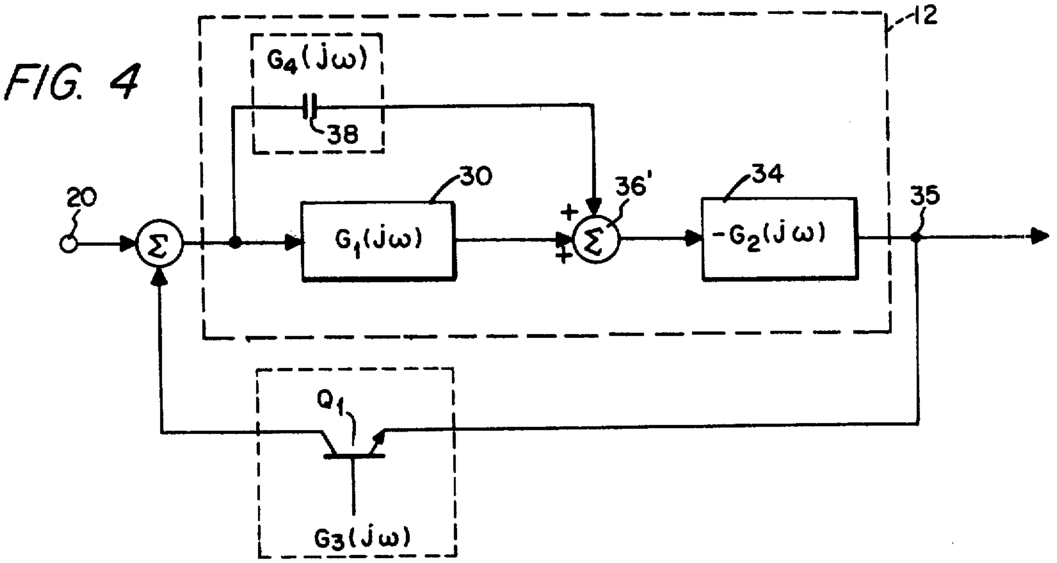
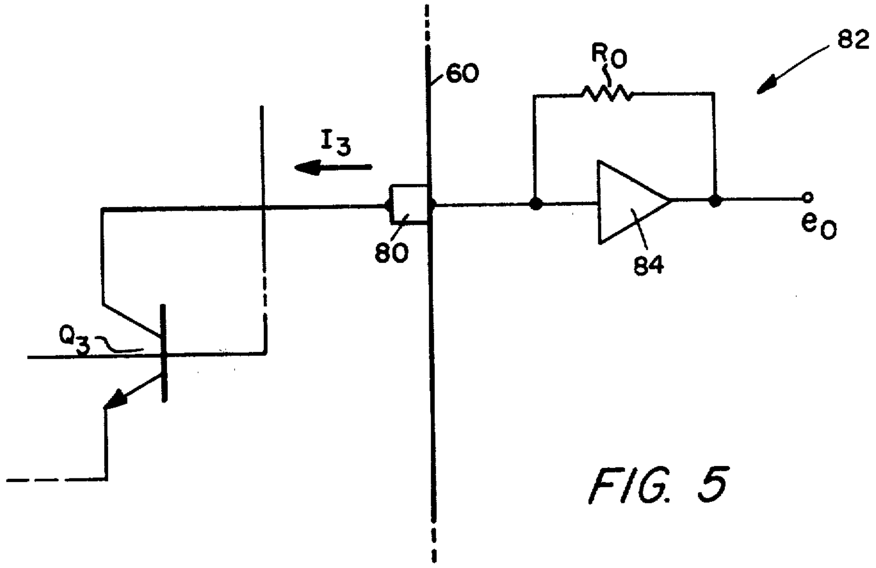
FIG. 5

ELECTRONIC CIRCUITRY FOR MULTIPLYING/DIVIDING ANALOG INPUT SIGNALS

BACKGROUND OF THE INVENTION

This invention relates generally to electronic circuitry and more particularly to electronic circuitry adapted to multiply/divide analog input signals.

As is known in the art, electronic circuitry adapted to multiply/divide analog input signals has a wide varity of applications. One such circuit, or so-called "log-antilog multiplier", includes four transistors having serially coupled base-emitter junctions. An output current is produced in the collector electrode of an output one of such transistors which is, to an approximation, proportional to the product of a pair of currents fed into the collector electrodes of two of the other ones of the transistors divided by a reference current fed into the collector electrode of the fourth one of such transistors. With such arrangement the effective ohmic emitter resistances of the transistors introduce a net error voltage in the circuit, thereby adversely affecting the accuracy of the multiplication/division process. One technique suggested to remove this source of error (discussed in U.S. Pat. No. 3,805,092 issued Apr. 16, 1974) is to provide a compensation resistor connected between the base electrodes of a pair of the transistors. An operational amplifier, coupled to the collector electrode of an output transistor, is also provided to produce an output voltage proportional to the product of the pair of currents divided by the reference current. The voltage is used to produce a compensation current in the compensation resistor to remove the net error voltage produced by the ohmic emitter resistances of the transistors. While such technique may be useful in some applications, the use of an operational amplifier in the output makes the use of such circuit difficult, if not impractical, for integrated circuit fabrication because such amplifier, being fed by the output current, produces thermal gradients across the wafer which have significant adverse effects on the linearity of other devices also formed on such wafer. Further, the use of such operational amplifier in the output as part of the integrated circuit generally limits the application of the integrated circuit to an analog multiplier circuit and therefore such integrated circuit may not be readily adapted for use in other applications, such as: a variable gain amplifier, modulator, demodulator, AGC amplifier, RMS to D.C. converter, divider, square root circuit, etc..

SUMMARY OF THE INVENTION

With this background of the invention in mind it is therefore an object of this invention to provide an improved analog electronic circuit.

It is another object of the invention to provide an improved electronic circuit adapted for use as an analog multiplier/divider and adapted to fabrication as an integrated circuit.

It is still another object of this invention to provide an improved electronic analog multiplier/divider circuit having circuitry to compensate for the effect of the ohmic emitter resistances of transistors used in such circuit.

These and other objects of the invention are attained generally by providing an electronic circuit having: A first plurality of transistors having serially coupled base-emitter junctions; a second plurality of transistors, each one thereof having a base electrode and emitter electrode connected to the base electrode and emitter electrode, respectively, of a corresponding one of the first plurality of transistors; and means, coupled to the collector electrodes of the second plurality of transistors, for producing a voltage in series with the serially coupled base-emitter junctions of the first plurality of transistors related to voltages produced across ohmic emitter resistances of the first plurality of transistors.

In a preferred embodiment of the invention, the first plurality of transistors includes four transistors: the emitter electrode of a first one thereof is connected to the base electrode of a second one thereof; the emitter electrode of the second one thereof is connected to the emitter electrode of the third one thereof; and the emitter electrode of a fourth one thereof is connected to the base electrode of the third one of the transistors. The collector electrodes of the transistors in the second plurality thereof which are connected to the first and second transistors of the first plurality of transistors are connected together at a first junction and the current flow in such collector electrodes is related to the current flow in the ohmic emitter resistances of the first and second transistors. The collector electrodes of the transistors in the second plurality thereof which are connected to the third and fourth transistors of the first plurality of transistors are connected together at a second junction and the current flow in such collector electrodes is related to the current flow in the ohmic emitter resistances of the third and fourth transistors. The voltage producing means includes resistors connected at the first and second junctions, the resistance of such resistors being related to the ohmic emitter resistances of the first plurality of transistors. The current flow into the first junction passes through one of such resistors to produce a first compensation voltage at the first junction related to the voltages produced across ohmic emitter resistances of the first and second transistors and the current flow into the second junction passes through the second one of the resistors to produce a second compensation voltage at the second junction related to the voltages produced across the ohmic emitter resistances of the third and fourth transistors. The first compensation voltage is fed in series with the serially coupled base-emitter junctions of the first and second transistors. In a preferred embodiment of the invention the base electrode of the fourth transistor is coupled at the first junction and the base electrode of the first transistor is connected at the second junction. The current flow in the collector electrode of the third transistor (i.e. the output transistor) is proportional to the product of the current flow in the collector electrode of the first and second transistors divided by the current flow in the collector electrode of the fourth transistor.

With such arrangement the effect of ohmic emitter resistance has been removed without the need for an operational amplifier coupled to the collector electrode of the output (i.e. the third) transistor thereby enabling fabrication of such circuit as a practical integrated circuit component.

BRIEF DESCRIPTION OF THE DRAWINGS

The above-mentioned and other features of the invention will become more apparent by reference to the following description taken together with the accompanying drawings, in which:

FIG. 4 is a block diagram of the differential amplifier section shown in FIG. 2; and FIG. 5 is a schematic diagram of an output circuit for the electronic circuitry in FIG. 3.

DESCRIPTION OF THE PREFERRED EMBODIMENT

Figure 1:
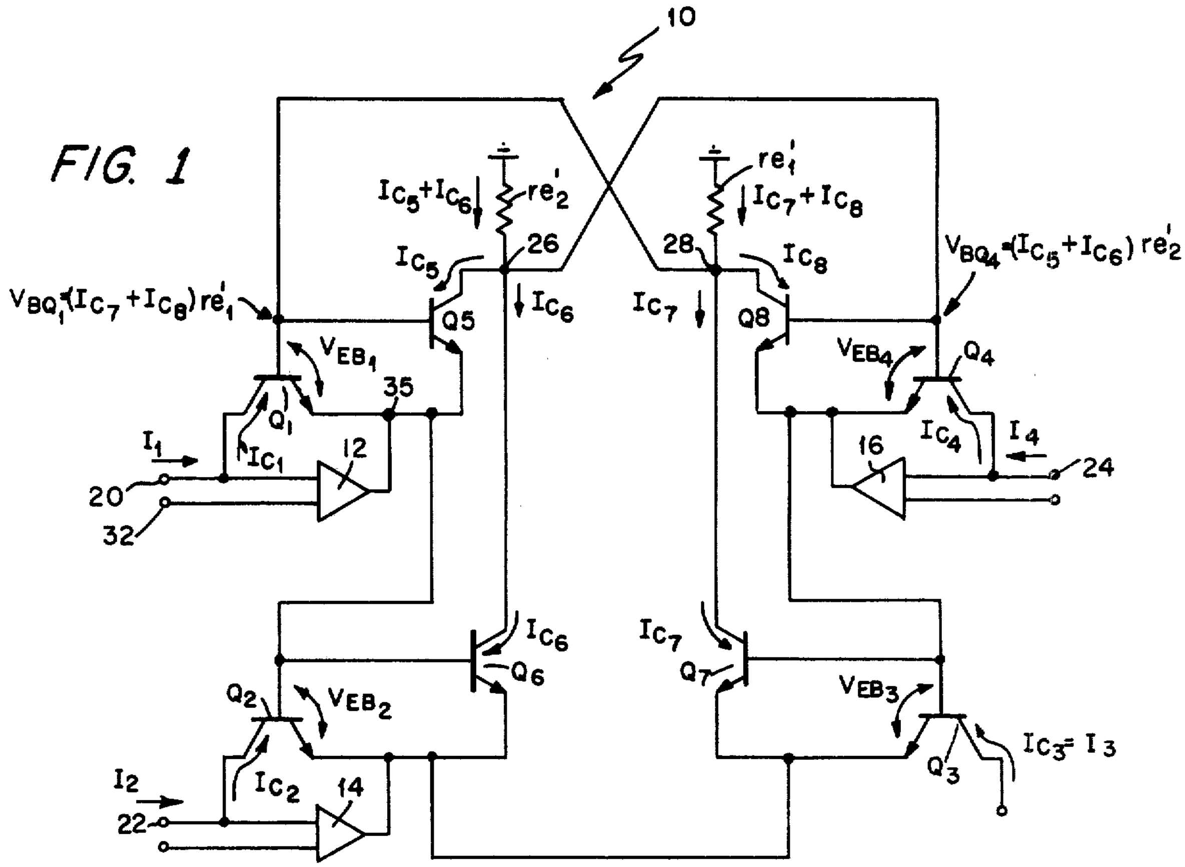
FIG. 1 is a schematic diagram of electronic circuitry according to the invention.

Referring now to FIG. 1, an electronic circuit 10 adapted to produce an output current $I_{C3}$ in the collector electrode of transistor $Q_3$ proportional to the product of the current $I_{C1}$ in the collector electrode of transistor $Q_1$ and the current $I_{C2}$ in the collector electrode of transistor $Q_2$ divided by the current $I_{C4}$ in the collector electrode of transistor $Q_4$ is shown. Such circuit 10 includes a first plurality of transistors $Q_1$, $Q_2$, $Q_3$, $Q_4$ having serially coupled base-emitter junctions. That is, the emitter electrode of transistor $Q_1$ is connected to the base electrode of transistor $Q_2$; the emitter electrodes of transistors $Q_2$, $Q_3$ are connected together and the base electrode of transistor $Q_3$ is connected to the emitter electrode of transistor $Q_4$, as shown. A second plurality of transistors $Q_5$, $Q_6$, $Q_7$, $Q_8$ is provided, the base electrode and emitter electrode of each one thereof being connected to the base electrode and emitter electrode, respectively, of a corresponding one of the first plurality of transistors $Q_1$, $Q_2$, $Q_3$, $Q_4$, as shown. In particular, the base electrode of transistor $Q_5$ is connected to the base electrode of transistor $Q_1$ and the emitter electrode of transistor $Q_5$ is connected to the emitter electrode of transistor $Q_1$. Likewise, the base electrode of transistor $Q_6$ is connected to the base electrode of transistor $Q_2$ and the emitter electrode of transistor $Q_6$ is connected to the emitter electrode of transistor $Q_2$. The base electrode of transistors $Q_8$ and $Q_4$ are connected together and the emitter electrodes of such transistors are connected together. Finally, the base electrodes of transistors $Q_3$ and $Q_7$ are connected together and the emitter electrodes of such transistors are connected together. It is here noted that the transistors $Q_1$–$Q_4$ and $Q_5$–$Q_8$ are formed on a common semiconductor substrate using conventional integrated circuit fabrication techniques. Transistors $Q_1$, $Q_5$; $Q_2$, $Q_6$; $Q_4$, $Q_8$ are matched pairs, having relatively large betas (i.e. the ratio of collector current to base current), here greater than two hundred. It follows then that the collector currents in each pair of transistors will be equal to each other. Hence: the collector current $I_{C5}$ in transistor $Q_5$ will be substantially equal to the collector current $I_{C1}$ in transistor $Q_1$, i.e. $I_{C5}=I_{C1}$; the collector current $I_{C6}$ in transistor $Q_6$ will be substantially equal to the collector current $I_{C2}$ in transistor $Q_2$ (i.e. $I_{C6}=I_{C2}$); the collector current $I_{C4}$ in transistor $Q_4$ will be substantially equal to the collector current $I_{C8}$ in transistor $Q_8$; and the collector current $I_{C7}$ in transistor $Q_7$ will be substantially equal to the collector current $I_{C3}$ in transistor $Q_3$.

The emitter-base-collector junctions of transistors $Q_1$, $Q_2$, $Q_4$ are connected in the feedback path of differential amplifier sections 12, 14, 16, respectively, as shown. The details of such differential amplifier sections 12, 14, 16 will be discussed in connection with FIGS. 2 and 3. Suffice it to say here, however, that such differential amplifier sections are identical in construction, have high gain and provide a very high input impedance to the signals fed thereto. Therefore, the current $I_1$ fed to terminal 20 of amplifier 12 is substantially the collector current $I_{C1}$ in transistor $Q_1$ (i.e. $I_1 \simeq I_{C1}$). Likewise, the currents fed to terminals 22, 24 of amplifiers 14, 16, respectively, are, substantially, the collector currents of transistors $Q_2$, $Q_4$, respectively, (i.e. $I_2 \simeq I_{C2}$, $I_4 \simeq I_{C4}$, respectively).

As is known, the base-emitter junction voltage $V_{BE}$ of a bipolar transistor may be expressed as:

$$V_{BE}=KT/q \ln I_C/I_S+(I_C)(Y_e) \quad (1)$$

where:

K is Boltzman's constant q is the electron charge

T is temperature

Ye is the ohmic emitter resistance of the transistor $I_C$ is the collector current (i.e., here substantially the emitter current because of the high beta of the transistor)

$I_S$ is the reverse saturation current of the transistor.

Referring to FIG. 1, it follows that the following expression may be written:

$$V_{BQ1}+V_{EB1}+V_{EB2}=V_{BQ4}+V_{EB4}+V_{EB3} \quad (2)$$

where:

$V_{BQ1}$ is the voltage at the base electrode of transistor $Q_1$;

$V_{EB1}$ is the voltage produced across the base-emitter junction of transistor $Q_1$;

$V_{EB2}$ is the voltage produced across the base-emitter junction of transistor $Q_2$;

$V_{BQ4}$ is the voltage at the base electrode of transistor $Q_4$;

$V_{EB4}$ is the voltage produced across the base-emitter junction of transistor $Q_4$; and $V_{EB3}$ is the voltage produced across the base-emitter junction of transistor $Q_3$.

Combining Eqs. (1) and (2) (and consisting that transistors $Q_1$–$Q_4$ are at the same temperature since they are formed on the same semiconductor substrate):

$$KT/q\,[\ln I_{C1}/I_{S1} + \ln I_{C2}/I_{S2} - \ln I_{C3}/I_{S3} - \ln I_{C4}/I_{S4}] + I_{C1}r_{e1} + I_{C2}r_{e2} - I_{C3}r_{e3} - I_{C4}r_{e4} = V_{BQ4} - V_{BQ1}; \quad (3)$$

where:

$I_{S1}$, $I_{S2}$, $I_{S3}$, $I_{S4}$ are the reverse saturation currents of transistors $Q_1$–$Q_4$, respectively, and;

$R_{e1}$–$r_{e4}$ are the ohmic emitter resistance of transistors $Q_1$–$Q_4$, respectively.

Assuming that $I_{S3}\ I_{S4}/I_{S1}\ I_{S2}$ is a constant, $\gamma$, and $r_{e1}=r_{e2}=r_{e3}=r_{e4}=r_e$ since all transistors are essentially matched since they are formed on the same semiconductor substrate, then, from the above, Equation (3) may be expressed as $$KT/\gamma q[\ln I_1I_2/I_3I_4]+(I_1+I_2-I_3-I_4)r_e=V_{BQ4}-V_{BQ1} \quad (4)$$

From Eq. (4) in order for:

$$\ln [I_1I_2/I_3I_4]=0 \quad (5)$$

in which case $I_3 = I_1 I_2 / I_4$, independent of temperature, the following must hold true:

$$(I_1+I_2)-(I_3+I_4)\,r_e = V_{BQ4} - V_{BQ1} \quad (6)$$

One way to satisfy Eq. (6) is if:

$$V_{BQ4} = (I_1+I_2)r_e \quad (7)$$

and (b) $V_{BQ1} = (I_3+I_4)r_e$ (8)

The collector electrodes of transistors $Q_5$, $Q_6$ are connected together at a first junction 26 and the collector electrodes of transistors $Q_7$, $Q_8$ are connected together at junction 28, as shown. A resistor $re_2'$ is connected between ground and the collector electrode of transistors $Q_5$, $Q_6$ at junction 26, as shown, and resistor $re_1'$ is connected between ground and the collector electrodes of transistors $Q_7$ and $Q_8$ at junction 28, as shown. Since the current flow through resistor $re_2'$ is $(I_{C5}+I_{C6})$, (i.e. the current in the base electrode of transistors $Q_4$, $Q_8$ being negligible) and the current flow in resistor $re_1'$ is $(I_{C7}+I_{C8})$ (i.e. the current in the base of the electrode of transistor $Q_1$, $Q_5$ being negligible), then:

$$V_{BQ4} = (I_{C5}+I_{C6})\ re_2' \text{ and} \quad (9)$$

$$V_{BQ1} = (I_{C7}+I_{C8})\ re_1' \quad (10)$$

As mentioned above, because matched transistors $Q_1$, $Q_5$; $Q_2$, $Q_6$; $Q_4$, $Q_8$; and $Q_7$, $Q_3$ have base electrodes connected together and emitter electrodes connected together, $I_1 = I_{C5}$; $I_2 = I_{C6}$; $I_4 = I_{C8}$; and $I_3 = I_{C7}$. Therefore, from Eqs. (9), (10), $$V_{BQ4} = (I_1+I_2)\ re_2' \quad (11)$$

$$V_{BQ1} = (I_3+I_4)\ re_1' \quad (12)$$

Consequently, from Eqs. (5), (6), (7), (8), and Eqs. (11) and (12), if $Ye = re_1' = re_2'$, then $$\ln\,[I_1I_2/I_3I_4] = 0 \text{ and}$$

$$I_3 = I_1 I_2 / I_4.$$

Here resistors $re_1'$ and $re_2'$ are equal to the ohmic emitter resistance Ye, of the transistors $Q_1$-$Q_4$; and, therefore, the current $I_3$ in the collector electrode of transistor $Q_3$ is equal to the product of the currents $I_1$, $I_2$ divided by the current $I_3$. Further, the transistors $Q_5$, $Q_6$, $Q_7$, $Q_8$ produce current in the collector electrodes related to the current flow through the basic emitter resistances of transistors $Q_1$, $Q_2$, $Q_3$, $Q_4$, respectively. The collector electrodes are fed through resistors $re_1'$, $re_2'$ to produce compensation voltages $V_{BQ1}$, $V_{BQ4}$ in series with the serially coupled base-emitter junctions of transistors $Q_1$-$Q_4$ to compensate for the ohmic emitter resistance voltage drops produced in such transistors. The compensation voltage $V_{BQ1}$ produced in series with the base-emitter junctions of transistors $Q_1$, $Q_2$ is produced by monitoring the current flow $(I_3+I_4)$ in the collectors of transistors $Q_3$, $Q_4$ with transistors $Q_7$, $Q_8$, passing such monitoring current through resistor $re_1'$, and feeding the compensation voltage $(I_3+I_4)\ re_1'$ with proper polarity to the base electrode of transistor $Q_1$. Likewise, the compensation voltage $V_{BQ4}$ is produced by monitoring the current flow $(I_1+I_2)$ in the collectors of transistors $Q_1$, $Q_2$ with transistors $Q_5$, $Q_6$, passing such monitoring current through resistor $re_2'$, and feeding the compensation voltage $(I_1+I_2)\ re_2'$ with proper polarity to the base electrode of transistor $Q_4$.

Figure 2:
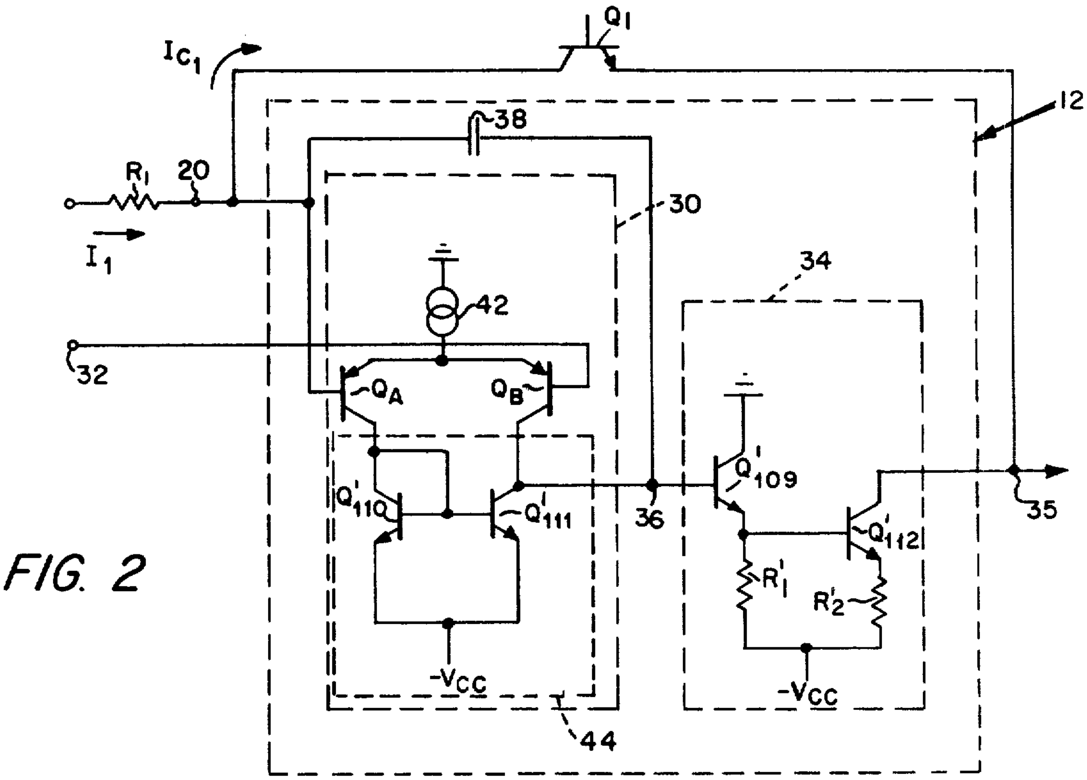
FIG. 2 is a schematic diagram of a differential amplifier section used in the electronic circuitry shown in FIG. 1.

Referring now to FIG. 2, an exemplary one of the differential amplifier sections 12, 14, 16, differential amplifier section 12, is shown to include a differential amplifier 30 having a pair of input terinals 20, 32; a current source 34 coupled to the output 36 of the differential amplifier 30; and a capacitor 38 connected between the input terminal 20 and output 36, as shown. It is noted that transistor $Q_1$ is connected in the feedback path of the differential amplifier section 12; that is, the collector electrode of transistor $Q_1$ is connected directly to the input terminal 20, and the emitter electrode is connected to the output 36 of such differential amplifier section 12, as shown.

Differential amplifier 30 includes a pair of transistors $Q_A$, $Q_B$. The base electrodes of such transistors $Q_A$, $Q_B$ are connected to input terminals 20, 32, respectively, as shown. The emitter electrodes of such transistors $Q_A$, $Q_B$ are coupled to a common reference potential, here ground potential, through a current source 42, as shown. The collector electrodes of transistors $Q_A$, $Q_B$ are coupled to a current mirror circuit 44, as shown. Current mirror circuit 44 converts the differential current flowing in the collector electrodes of transistors $Q_A$, $Q_B$ to a voltage at the output 36, such voltage being related to the differential voltage produced between input terminals 32, 20. The current mirror circuit 44 includes a pair of transistors $Q_{110}'$, $Q_{111}'$ having base electrodes connected together and to the collector electrode of transistor $Q_{110}'$. The collector electrode of transistor $Q_{110}'$ is connected to the collector electrode of transistor $Q_A$ and the collector electrode of transistor $Q_{111}'$ is connected to the collector electrode of transistor $Q_B$ and provides the output 36. The emitter electrodes of transistors $Q_{110}'$, $Q_{111}'$ are connected together and to a $-V_{cc}$ supply. Transistor $Q_{110}'$ is therefore connected to form a diode.

The current source 34 includes a pair of transistors $Q_{109}'$, $Q_{112}'$. Transistor $Q_{109}'$ is arranged as an emitter-follower and buffers transistor $Q_{112}'$ from output 36. The base electrode of transistor $Q_{109}'$ is connected to output 36, its collector electrode is connected to ground, and its emitter electrode is connected to the $-V_{cc}$ supply through a resistor $R_1'$ (here 20 ohms), as shown. Transistor $Q_{112}'$ has its base electrode connected to the emitter electrode of transistor $Q_{109}'$, its emitter electrode connected to the $-V_{cc}$ supply through a resistor $R_2'$ (here 511 ohms), and its collector electrode connected directly to output terminal 35 (and hence connected directly to the emitter electrode of transistor $Q_1$).

In operation, the current flows through the collector electrode of transistor $Q_{112}'$, the amount of such current flow being proportional to the difference in potential between the analog signals coupled to input terminals 32, 20. Since input terminal 32 is adapted for coupling to a predetermined reference potential, here near ground potential, the voltage at output 36 is related to the voltage at input terminal 20. The voltage at output 36, i.e. at the base electrode of transistor $Q_{109}'$, determines the amount of current flow through the collector electrode of transistor $Q_{112}'$. Hence, the amount of current flow through transistor $Q_{112}'$ is proportional to the voltage of the input signal coupled to input terminal 20. In particular, the circuit shown in FIG. 2 may be represented by the block diagram shown in FIG. 4 in order to analyze the dynamic characteristics of the differential amplifier section 12 with transistor $Q_1$ connected in a feedback arrangement with such section 12. The differential amplifier 30 is represented by a block 30 having a transfer function $G_1(j\omega)$ and the capacitor 38 is represented by a transfer function $G_4(j\omega)=j\omega C$, where C is the capacitance of capacitor 38 The input to capacitor 38 and differential amplifier 30 are the same and the outputs are added at terminal 36', here represented by an adder 36'. The current source 34 is fed by the signals produced at the output of adder 36' and such source 34 may be represented by a transfer function, $-G_2(j\omega)$. The transfer function of transistor $Q_1$ may be represented as $G_3(j\omega)$. Absent the capacitor 38 the open loop gain of the system shown in FIG. 4 is:

$$A(j\omega)=-G_1(j\omega)\cdot G_2(j\omega)\cdot G_3(j\omega). \quad (13)$$

Further, such system, absent capacitor 38, is unstable. In particular, there is, absent capacitor 38, excessive phase lag provided by, inter alia, the differential amplifier 30 to high frequency components. The system is made stable by capacitor 38. In particular, because the transfer function of capacitor 38 is $G_4(j\omega)=j\omega C$ the value of capacitance, C, is selected to add phase lead to the high frequency components and thereby cancel or compensate for the phase lag provided to these high frequency components by differential amplifier 30. That is, the capacitor 38 provides a lead network for stabilizing the closed loop response of the differential amplifier section 12 with the transistor $Q_1$ coupled in feedback relationship with such section 12 as shown in FIG. 4. To put it still another way, the open loop gain, $A(j\omega)$, of the system for low frequencies is given in Eq. (13). However, for high frequencies, (i.e. beyond the bandwidth of the differential amplifier 30) such open loop gain is $$A(j\omega)=-(j\omega C)G_2(j\omega)G_3(j\omega) \quad (14)$$

such that the overall open loop gain, considering all frequencies, satisfies the Nyquist stability criterion. By providing the differential amplifier section 12 with a current source output and connecting the capacitor 38 between input terminal 20 and output 36, the response of the amplifier section in enabling the collector current $I_{c1}$ in transistor $Q_1$ to reach a steady state level proportional to the voltage applied to terminal 20 is extremely rapid. Since normally input terminal 20 is coupled to an input resistor, here resistor $R_1$, the current flow in the collector of transistor $Q_{112}'$ (and hence the collector current $I_{c1}$ in transistor $Q_1$) will rapidly become proportional to $I_1$.

Figure 3:
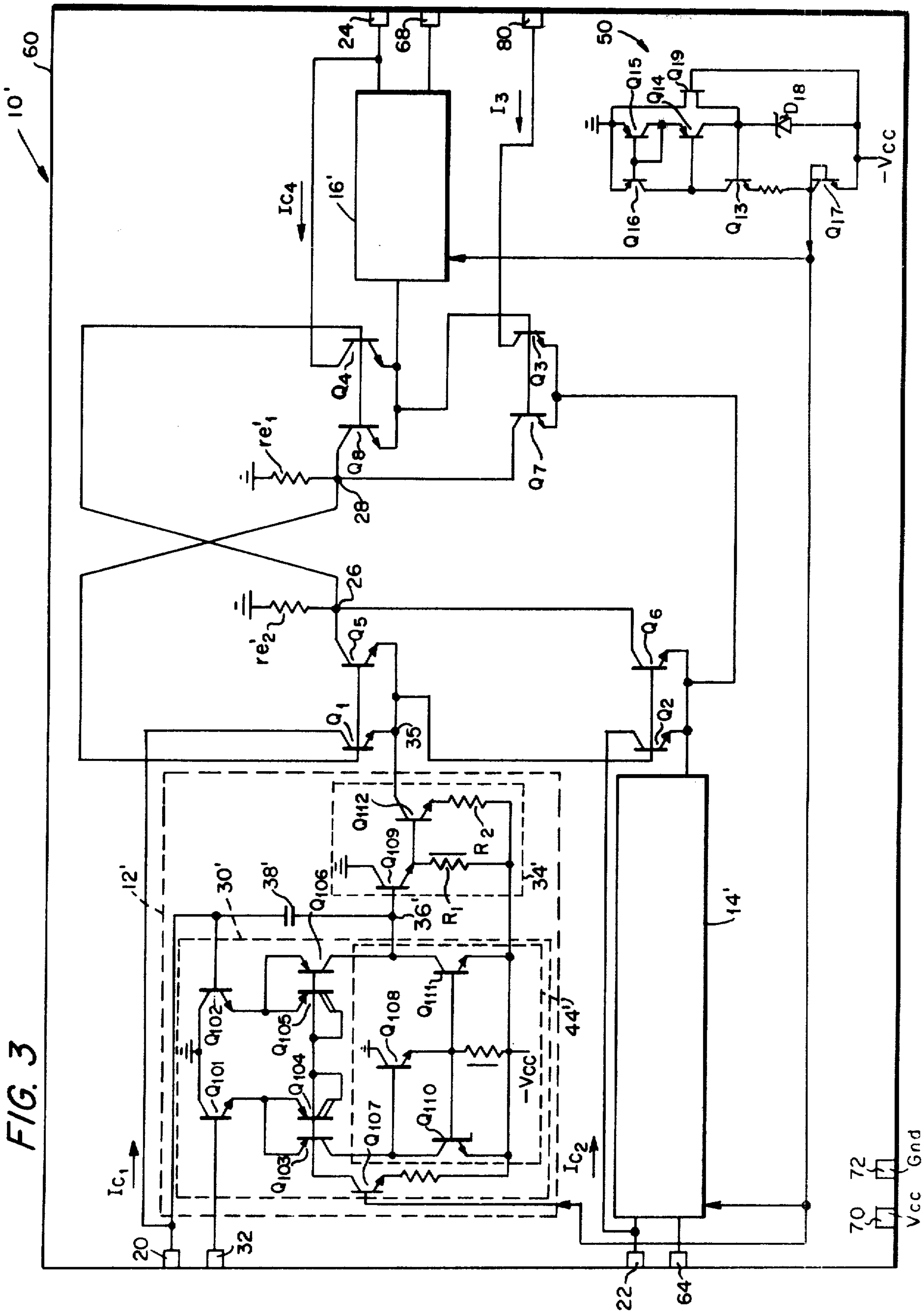
FIG. 3 is a schematic diagram of the electronic circuitry according to the invention.

Referring now to FIG. 3, an analog multiplier/divider circuit 10' is shown. Such circuit is similar to the circuit 10 described in connection with FIG. 1, common elements having the same designation and equivalent elements having a "primed" (') superscript designation. Thus, the circuit shown in FIG. 3 has differential amplifying sections 12', 14', 16', as shown. An exemplary one of the differential amplifier sections 12', 14', 16', here section 12', is shown in detail to include: a differential amplifier 30' coupled to input terminals 20, 32; a current mirror circuit 44' fed by the differential amplifier 30' to produce a voltage at output 36' which is proportional to the difference in potential of signals fed to terminals 20, 32; a capacitor 38', here in the order of 25PF, connected between the output 36' and the input terminal 20, as shown; and a current source 34' coupled to output 36', as shown.

Transistors $Q_{101}$, $Q_{102}$, $Q_{103}$, $Q_{104}$, $Q_{105}$, $Q_{106}$ and $Q_{107}$ are arranged to function as the transistors $Q_A$, $Q_B$ and the current source 42 as shown in FIG. 2. Transistors $Q_{101}$, $Q_{102}$ have their collector electrodes connected to ground. The base electrode of transistor $Q_{101}$ is connected to input terminal 32, and the base electrode of transistor $Q_{102}$ is connected to input terminal 20 and the capacitor 38', as shown. Transistors $Q_{103}$, $Q_{104}$, $Q_{105}$, $Q_{106}$ have base electrodes connected together and to the collector electrode of transistor $Q_{107}$, as shown. The emitter electrodes of transistors $Q_{103}$, $Q_{104}$ are connected together and to the emitter electrode of transistor $Q_{101}$. The emitter electrodes of transistors $Q_{105}$, $Q_{106}$ are connected together and to the emitter electrodes of transistor $Q_{102}$. The collector electrodes of transistors $Q_{104}$ and $Q_{105}$ are connected to the base electrodes of such transistors, as shown. The base electrode of transistor $Q_{107}$ is connected to a reference voltage source 50, and the emitter electrode of such transistor $Q_{107}$ is connected to the $-V_{cc}$ supply through a resistor, here 3320 ohms, as shown. The reference voltage source 50 produces a reference voltage, here $(-V_{cc}+0.7)$ volts, at the base electrode of transistor $Q_{107}$. The collector electrodes of transistors $Q_{103}$, $Q_{106}$ are fed to current mirror circuit 44', as shown. Current mirror circuit 44' produces a voltage at output 36' which is proportional to the difference in voltage at the input terminals 20, 32. Such current mirror circuit includes a transistor $Q_{110}$ having: its emitter electrode connected to $-V_{cc}$; its collector electrode connected to the collector electrode of transistor $Q_{103}$ and to the base electrode of transistor $Q_{108}$; and its base electrode connected to the emitter electrode of transistor $Q_{108}$, the base electrode of transistor $Q_{111}$ and to $-V_{cc}$ through a resistor, here 20 K ohms, as shown. Transistor $Q_{111}$ has its collector electrode connected to the collector electrode of transistor $Q_{106}$ and to the output 36' and its emitter electrode connected to $-V_{cc}$, as shown.

Current source 34' is coupled to the output 36', as shown, and includes a pair of transistors $Q_{109}$, $Q_{112}$, as shown. Transistor $Q_{109}$ has its emitter grounded, its base electrode connected to output 36' and its emitter electrode connected to $-V_{cc}$ through a resistor, $R_1$, here 20 K ohms, and the base electrode of transistor $Q_{112}$.

The emitter electrode of transistor $Q_{112}$ is connected to $-V_{cc}$ through a resistor $R_2$, here 511 ohms. The collector electrode of transistor $Q_{112}$ is connected to output terminal 35 and the emitter electrode of transistors $Q_1$, $Q_5$, as shown. In operation, the amount of current flow through current source 34' is related to the voltage at output 36' and, hence, to the differential voltage between terminals 20, 32. Further, the current flow through such current source 34' is related to the current flow through the emitter electrode of transistor $Q_1$. Still further, the amount of current flow in the base electrode of transistor $Q_{102}$ is negligible compared to the current flow in the emitter electrode of transistor $Q_1$. Therefore, differential amplifier section 12', with the capacitor 38' connected between the input terminal 20 and output 36', enables the collector current of transistor $Q_1$ to rapidly achieve a steady state level related to the amount of current fed to terminal 20, i.e., the current $I_1$, as described in connection with FIGS. 1, 2 and 4.

Reference voltage source 50 here includes an output transistor $Q_{17}$ arranged as a diode to provide a voltage $(-V_{cc}+0.7)$ volts at its collector electrode. In particular, the emitter of transistor $Q_{17}$ is connected to $-V_{cc}$ and the base of such transistor is connected to its collector, as shown. The $-V_{cc}$ supply is connected to the base electrode of transistor $Q_{13}$, the collector electrode of transistor $Q_{14}$ and the source electrode of FET $Q_{19}$, through a Zener diode $D_{18}$, as shown. The collector electrode of transistor $Q_{13}$ is connected to the base electrode of transistor $Q_{14}$ and to the collector electrode of transistor $Q_{16}$, as shown. The emitter electrode of transistor $Q_{14}$ is connected to the base electrodes of transistors $Q_{16}$, $Q_{15}$, as shown. The emitter electrodes of transistors $Q_{16}$, $Q_{15}$ and the drain electrodes of FET $Q_{19}$ are connected to ground, as shown.

The analog multiplier/divider circuit 10' shown in FIG. 3 is formed on a semiconductor substrate 60 using conventional processing techniques. The substrate 60 has also formed thereon the input terminals 20, 32 for differential amplifier section 12'; input terminals 22, 64 for differential amplifier section 14'; input terminals 24, 68 for differential amplifier section 16'; a terminal 70 to enable connection to $-V_{cc}$ of a suitable voltage supply (not shown); and a terminal 72 to enable a connection to ground of such supply. (It is noted that terminal 68 may be removed by electrically connecting such point to ground.) An output terminal 80 is also formed on such substrate 60, such terminal 80 being connected to the collector electrode of transistor $Q_3$, as shown.

Referring also to FIG. 5, an output network 82 is shown connected to the collector electrode of transistor $Q_3$ via the output terminal 80 formed on the substrate 60. Such output network 82 includes an operational amplifier 84 having a feedback resistor $R_o$. The input to such amplifier 84 is connected to both the terminal 80 and the output of such operational amplifier. Therefore, such amplifier 84 produces a voltage $e_o$ proportional to the collector current $I_3$ of transistor $Q_3$. It is noted that the output network 82 is not here formed on the substrate 60 thereby enabling the circuit 10' formed on such substrate to be used in a wide variety of applications, such as: variable gain amplifier; square root circuit, etc..

Having described a preferred embodiment of this invention it is now evident that other embodiments incorporating these concepts may be used. It is felt, therefore, that this invention should not be restricted to the disclosed embodiment, but rather should be limited only by the spirit and scope of the appended claims.

What is claimed is:

1. An electronic circuit comprising:

(a) a first set of four transistors having serially coupled base-emitter junctions, each one of such transistors having an ohmic emitter resistance;

(b) means, including a second set of four transistors, each one having a base electrode and an emitter electrode connected to the base electrode and emitter electrode, respectively, of a corresponding one of the first set of transistors, for producing current in the collector electrode of each one of the second set of transistors related to the current flow through the ohmic emitter resistance of the corresponding one of the transistors in the first set of transistors coupled thereto, a first pair of the first set of transistors having the base and emitter electrodes thereof connected to the base and emitter electrodes, respectively, of a first pair of the second set of transistors and a second pair of the first set of transistors having the base and emitter electrodes thereof connected to the base and emitter electrodes, respectively, of a second pair of the second set of transistors;

(c) means responsive to the current flow through the collector electrodes of the first pair of the second set of transistors for producing a first voltage in series with the serially coupled base-emitter junctions of the first pair of the first set of transistors, such first series produced voltage having a polarity opposite to the polarity of voltages developed across the ohmic emitter resistances of the first pair of the first set of transistors; and (d) means, responsive to the current flow through the collector electrodes of the second pair of the second set of transistors, for producing a second voltage in series with the base-emitter junctions of the second pair of the first set of transistors, such second series produced voltage having a polarity opposite to the polarity of voltages developed across the ohmic emitter resistances of the second pair of the first set of transistors.

2. The electronic circuit recited in claim 1 wherein the voltage producing means includes a pair of resistors, a first one of such resistors being coupled to the collector electrodes of the first pair of the second set of transistors and to the base electrode of one of the transistors in the second pair of the first set of transistors and a second one of such resistors being coupled to the collector electrodes of the second pair of the second set of transistors and to the base electrodes of one of the transistors in the first pair of the first set of transistors, and wherein the pair of resistors have resistances related to the ohmic emitter resistances of the first set of transistors.

3. The electronic circuit recited in claim 2 wherein each one of the transistors in the first set thereof is matched to the corresponding transistor in the second set thereof coupled thereto.

4. An electronic circuit comprising:

(a) a first plurality of transistors having serially coupled base-emitter junctions and having ohmic emitter resistances;

(b) a second plurality of transistors, each one thereof having a base electrode and an emitter electrode connected to a base electrode and an emitter electrode, respectively, of a corresponding one of the first plurality of transistors; and (c) means, coupled to collector electrodes of the second plurality of transistors, for producing voltages in series with the serially coupled base-emitter junctions of the first plurality of transistors related to and having opposing polarity to voltages developed across the ohmic emitter resistance of the first plurality of transistors.

5. The electronic circuit recited in claim 4 wherein:

(a) the first plurality of transistors includes four transistors; the emitter electrode of a first one thereof being connected to the base electrode of a second one thereof; the emitter electrode of the second one thereof being connected to the emitter electrode of the third one thereof; and the emitter electrode of a fourth one thereof being connected to the base electrode of the third one thereof;

(b) the collector electrodes of the transistors in the second plurality thereof which are connected to the first and second transistors of the first plurality of transistors being connected together at a first junction, the current flow in such collector electrodes being related to the current flow in the ohmic emitter resistances of the first and second transistors of the first plurality of transistors;

(c) the collector electrodes of the transistors in the second plurality thereof which are connected to the third and fourth transistors of the first plurality of transistors being connected together at a second junction, the current flow in such second junction being related to the current flow in the ohmic emitter resistances of the third and fourth transistors of the first plurality of transistors; and (d) the voltage producing means includes resistors connected at the first and second junctions, the resistances of such resistors being related to the ohmic emitter resistances of the first plurality of transistors.

6. The electronic circuit recited in claim 5 wherein each one of the transistors of the first plurality of transistors is matched to the corresponding transistor in the second plurality of transistors coupled thereto.

7. An electronic circuit, comprising:

(a) a first transistor having an emitter, such emitter having ohmic resistance, current flow through the emitter developing a voltage drop across such ohmic resistance;

(b) means, comprising a second transistor having a base and an emitter connected to a base and the emitter, respectively, of the first transistor, for producing a current flow in a collector of the second transistor related to the current flow through the emitter of the first transistor; and (c) means, responsive to the current flow through the collector of the second transistor, for producing a voltage in series with, and related to, the voltage drop developed across the ohmic resistance of the emitter of the first transistor, such produced voltage having a polarity opposite to the polarity of the voltage developed across such ohmic resistance.

8. An electronic circuit, comprising:

(a) a first plurality of transistors, each one thereof having an emitter and a base-emitter junction, each one of the emitters having ohmic resistance, current flow through each one of the emitters developing a voltage across such ohmic resistance, such first plurality of transistors having serially coupled base-emitter junctions;

(b) means, comprising: a second plurality of transistors, each one of a first portion of the second plurality of transistors having a base and emitter connected to a base and emitter, respectively, of a corresponding one of a first portion of the first plurality of transistors, each one of a second portion of the second plurality of transistors having a base and emitter connected to a base and emitter, respectively, of a corresponding one of a second portion of the first plurality of transistors, for producing current flow in the collector electrode of each one of the second plurality of transistors related to the current flow through the emitter of the corresponding one of the first plurality of transistors connected thereto;

(c) means, responsive to the current flow through the collector of each one of the transistors of the first portion of the second plurality of transistors, for producing a first voltage in series with the serially coupled base-emitter junctions of the first plurality of transistors and in series with, and with opposing polarity to, each voltage developed across the ohmic resistance of the emitter of each one of the transistors of the first portion of the first plurality of transistors; and (d) means, responsive to the current flow through the collector of each one of the transistors of the second portion of the second plurality of transistors, for producing a second voltage in series with the serially coupled base-emitter junctions of the first plurality of transistors and in series with, and with opposing polarity to, each voltage developed across the ohmic emitter resistance of each one of the transistors in the second portion of the first plurality of transistors.

9. An electronic circuit comprising:

(a) a first plurality of transistors having serially coupled base-emitter junctions, such transistors having ohmic emitter resistances developing ohmic emitter voltages in response to emitter current flow through such ohmic emitter resistances;

(b) means, including a second plurality of transistors, each one having a base electrode and an emitter electrode connected to the base electrode and emitter electrode, respectively, of a corresponding one of the first plurality of transistors, for producing current in the collector electrodes of such second plurality of transistors related to emitter current flow through the ohmic emitter resistances of the first plurality of transistors; and (c) means, responsive to the current produced in the collector electrodes of the second plurality of transistors, for producing voltages in series with the serially coupled base-emitter junctions of the first plurality of transistors, such serially produced voltages being related to, and being produced with opposing polarity to, ohmic emitter voltages developed by the ohmic emitter resistances.

10. An electronic circuit, comprising:

(a) a first pair of transistors having serially coupled base-emitter junctions, each one of such transistors having an ohmic emitter resistance;

(b) a second pair of transistors having serially coupled base-emitter junctions, each one of such transistors having an ohmic emitter resistance, an emitter electrode of a first one of the first pair of transistors being connected to an emitter electrode of a first one of the second pair of transistors;

(c) a third pair of transistors, each one thereof having a base electrode and an emitter electrode connected to the base electrode and the emitter electrode, respectively, of a corresponding one of the first pair of transistors;

(d) a fourth pair of transistors, each one thereof having a base electrode and an emitter electrode connected to the base electrode and the emitter electrode, respectively, of a corresponding one of the second pair of transistors;

(e) means, coupled to collector electrodes of the third pair of transistors, for producing a voltage in series with the serially coupled base-emitter junctions of the first pair of transistors proportional to, and having opposing polarity from, the sum of voltages produced across the ohmic emitter resistances of the first pair of transistors; and (f) means, coupled to collector electrodes of the fourth pair of transistors, for producing a voltage in series with the serially coupled base-emitter junctions of the second pair of transistors proportional to, and having opposing polarity from, the sum of the voltages produced across the ohmic emitter resistances of the second pair of transistors.

11. An electronic circuit, comprising:

(a) a first pair of transistors having serially coupled base-emitter junctions;

(b) a second pair of transistors having serially coupled base-emitter junctions, an emitter electrode of a first one of the first pair of transistors being connected to an emitter electrode of a first one of the second pair of transistors;

(c) a third pair of transistors, each one thereof having a base electrode and an emitter electrode connected to the base electrode and the emitter electrode, respectively, of a corresponding one of the first pair of transistors;

(d) a fourth pair of transistors, each one thereof having a base electrode and an emitter electrode connected to the base electrode and the emitter electrode, respectively, of a corresponding one of the second pair of transistors;

(e) first means, coupled to the collector electrodes of the third pair of transistors for producing a voltage at a base electrode of a second one of the second pair of transistors related to the sum of current flow through the emitter electrodes of the first pair of transistors; and (f) second means, coupled to the collector electrodes of the fourth pair of transistors, for producing a voltage at a base electrode of a second one of the transistors of the first pair of transistors related to current flow through the emitter electrodes of the second pair of transistors.

12. The electronic circuit recited in claim 11 wherein:

the first means includes a first resistor having a first end thereof connected to the collector electrodes of the third pair of transistors and to the base electrode of the second one of the second pair of transistors;

the second means includes a second resistor having a first end thereof connected to the collector electrodes of the fourth pair of transistors and to the base electrode of the second one of the transistors in the first pair of transistors; and wherein second ends of the first and second resistors are serially connected.

13. An electronic circuit for producing an output current through an output terminal proportional to the product of a first current passing through a first input terminal and a second current passing through a second input terminal divided by a third current passing through a third input terminal, comprising:

(a) a first set of four transistors, each one having an ohmic emitter resistance, such first set of transistors having serially coupled base-emitter junctions, a first one of such transistors having a collector electrode coupled to the first terminal, a second one of such transistors having a collector electrode coupled to the second input terminal, a third one of such transistors having a collector electrode coupled to the third input terminal, and a fourth one of such transistors having a collector electrode coupled to the output terminal;

(b) means, including a second set of four transistors, each one having a base electrode and an emitter electrode connected to the base electrode and emitter electrode, respectively, of a corresponding one of the first set of transistors, adapted to produce current in the collector electrodes of the second set of transistors related to the current flows through the ohmic emitter resistances of the first set of transistors coupled thereto; and (c) means, coupled to the collector electrodes of the second set of transistors, for producing a voltage at the base electrode of the first one of the first set of transistors proportional to, and having opposing polarity to, the sum of voltages produced across the ohmic emitter resistances of the third and fourth ones of the first set of transistors and a voltage at the base electrode of the third one of the first set of transistors proportional to, and having opposing polarity to, the sum of voltages produced across the ohmic emitter resistances of the first and second ones of the first set of transistors.

14. An electronic circuit, comprising:

(a) a first plurality of transistors, each one having a base electrode, an emitter electrode, and a collector electrode, the emitter electrode of a first one thereof being connected to the base electrode of a second one thereof, the emitter electrode of the second one thereof being connected to the emitter electrode of a third one thereof, and the emitter electrode of a fourth one thereof being connected to the base electrode of the third one thereof;

(b) a second plurality of transistors, each one thereof having a base electrode, a collector electrode, and an emitter electrode, the base electrode and the emitter electrode of each one of such second plurality of transistors being connected to the base electrode and the emitter electrode, respectively, of a corresponding one of the first plurality of transistors;

(c) a first resistor connected to:

(i) the collector electrodes of the transistors of the second plurality of transistors having emitter electrodes connected to the emitter electrodes of the first and second transistors of the first plurality of transistors, and (ii) the base electrode of the fourth one of the first plurality of transistors; and (d) a second resistor connected to:

(i) the collector electrodes of the transistors in the second plurality of transistors having emitter electrodes connected to the emitter electrodes of the third and fourth ones of the first plurality of transistors, and (ii) the base electrode of the first one of the first plurality of transistors.

15. An electronic circuit, comprising:

(a) first, second, third and fourth transistors each one thereof having a base electrode, an emitter electrode, and a collector electrode;

(b) fifth, sixth, seventh and eighth transistors, each one having a base electrode, an emitter electrode, and a collector electrode, the base electrodes of the fifth, sixth, seventh and eighth transistors being connected to the base electrodes of the first, second, third and fourth transistors, respectively, the emitter electrodes of the fifth, sixth, seventh and eighth transistors being connected to the emitter electrodes of the first, second, third and fourth transistors, respectively, the emitter electrodes of the first and fifth transistors being connected to the base electrodes of the second and sixth transistors, the emitter electrodes of the third and seventh transistors being connected to the base electrodes of the fourth and eighth transistors, and the emitter electrodes of the second and sixth transistors being connected to the emitter electrodes of the fourth and eighth transistors; and (c) a first and second resistor, the first resistor having a first end connected to the collector electrodes of the fifth and sixth transistors and to the base electrode of the third transistor, the second resistor having a first end connected to the collector electrodes of the seventh and eighth transistors and to the base electrode of the first transistor.

16. The electronic circuit recited in claim 15 wherein second ends of the first and second resistors are connected together.

17. An electronic circuit, comprising:

(a) first, second, third and fourth transistors each one thereof having a base electrode, an emitter electrode and a collector electrode;

(b) first, second, and third amplifiers, each one thereof having an input and an output;

(c) means for connecting: the collector and emitter electrodes of the first transistor to the input and output, respectively, of the first amplifier; the collector electrode and emitter electrode of the second transistor to the input and output, respectively, of the second amplifier; and the collector and emitter electrodes of the third transistor to the input and output, respectively, of the third amplifier;

(d) fifth, sixth, seventh and eighth transistors, each one having a base electrode, an emitter electrode, and a collector electrode;

(e) means for connecting: the base electrodes of the fifth, sixth, seventh and eighth transistors to the base electrodes of the first, second, third and fourth transistors, respectively; and the emitter electrodes of the fifth, sixth, seventh and eighth transistors to the emitter electrodes of the first, second, third and fourth transistors, respectively;

(f) a first and a second resistor, the first resistor being connected to the collector electrodes of the fifth and sixth transistors and to the base electrode of the third transistor, the second resistor being connected to the collector electrodes of the seventh and eighth transistors and to the base electrode of the first transistor; and (g) means for connecting: the emitter electrodes of the first and fifth transistor to the base electrodes of the second and sixth transistors; the emitter electrodes of the third and seventh transistors to the base electrodes of the fourth and eighth transistors; and the emitter electrodes of the second and sixth transistors to the emitter electrodes of the fourth and eighth transistors.

* * * * *